United States Patent [19]
Liau et al.

[11] Patent Number: 4,784,722
[45] Date of Patent: Nov. 15, 1988

[54] METHOD FORMING SURFACE EMITTING DIODE LASER

[75] Inventors: Zong-Long Liau, Arlington; James N. Walpole, Concord, both of Mass.

[73] Assignee: Massachusetts Institute of Technology, Cambridge, Mass.

[21] Appl. No.: 109,945

[22] Filed: Oct. 19, 1987

Related U.S. Application Data

[62] Division of Ser. No. 693,207, Jan. 22, 1985, Pat. No. 4,718,070.

[51] Int. Cl.$^4$ .............. H01L 21/306; B44C 1/22; C03C 15/00; C03C 25/06
[52] U.S. Cl. ............................... 156/649; 156/652; 156/655; 156/659.1; 156/662; 437/129; 437/247
[58] Field of Search ............... 437/23, 126, 127, 129, 437/247, 248; 156/649, 652, 655, 659.1, 662; 357/16, 17, 19, 30; 372/43, 44, 45, 46, 50

[56] References Cited
U.S. PATENT DOCUMENTS

| | | | |
|---|---|---|---|
| 3,983,510 | 9/1976 | Hayashi et al. | 437/129 X |
| 4,188,244 | 2/1980 | Itoh et al. | 437/129 |
| 4,213,805 | 7/1980 | Tsukada | 156/649 X |

Primary Examiner—William A. Powell
Attorney, Agent, or Firm—Hamilton, Brook, Smith & Reynolds

[57] ABSTRACT

A method and apparatus for forming a monolithic surface emitting laser diode array by providing vertical partly light transmissive mirror surfaces opposite parabolic light reflective mirror surfaces formed adjacent the active buried layer of a heterostructure diode laser. The mirror surfaces are preferably formed using a mass-transport heating process. Other mirror shapes may be formed in accordance with the invention.

25 Claims, 7 Drawing Sheets

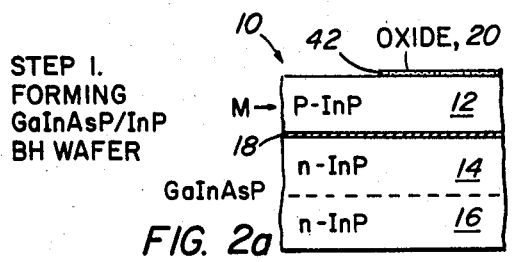
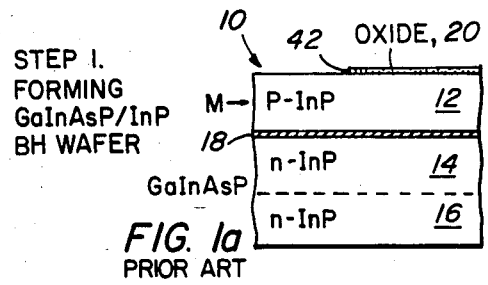
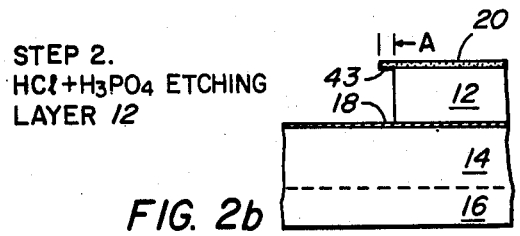
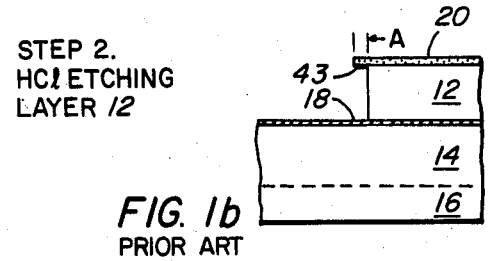
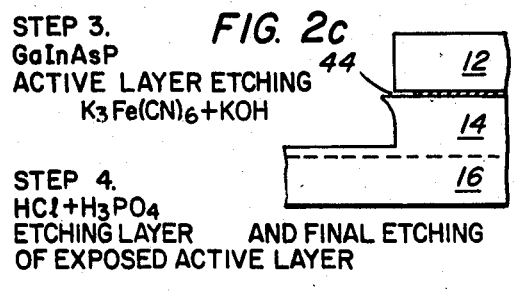
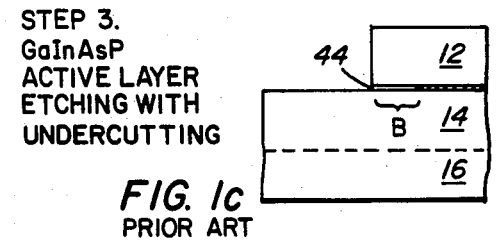
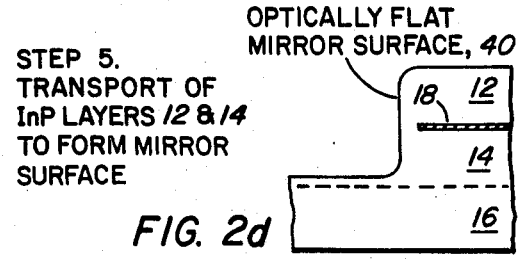
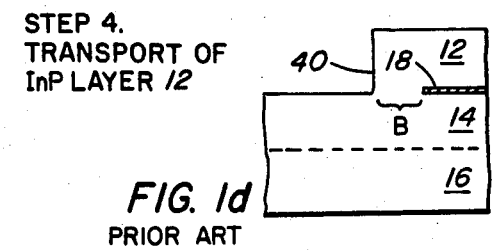
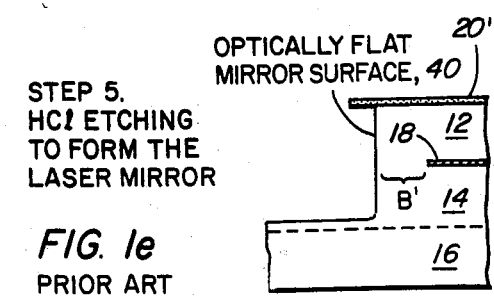

METHOD FORMING SURFACE EMITTING DIODE LASER

GOVERNMENT SUPPORT

The Government has rights in this invention pursuant to Contract No. F19628-85-C-0002, awarded by the Department of the Air Force.

This application is a division of applicaiton Ser. No. 693,207, filed 1/22/85, U.S. Pat. NO. 4,718,070.

TECHNICAL FIELD

This invention is in the field of semiconductor lasers and more particularly relates to GaInAsP/InP double-heterostructure (DH) lasers capable of pulsed and cw operation at room temperature.

BACKGROUND ART

Semiconductor lasers capable of producing continuous stimulated radiation at wavelengths in the vicinity of 1.1–1.7 um (micrometers) at room temperature are of interest for communications systems using fiber optics, since it is in this wavelength range that both the transmission losses and the dispersion in high-quality glass fibers are low.

Semiconductor lasers of quaternary III-V alloys of GaInAsP grown on a binary compound of InP (double-heterostructures or DH) have proven practical for operation at this frequency range. Furthermore, a particular type of laser construction, i.e., the buried layer type or BH laser for "buried heterostructure" laser; wherein the active layer (GaInAsP) is both vertically and laterally confined (*Proceedings of the IEEE*, Vol. 64, No. 10, October 76, pp 1528–1529) has been of particular importance for reducing threshold current $I_{th}$, and for increasing mode stability in semiconductor lasers.

As a result of this interest, various techniques for fabricating BH laser diodes have evolved.

Recently, a novel technique for fabricating BH lasers was described in U.S. Pat. No. 4,468,850 to Liau et al. issued Sept. 4, 1984, which utilizes a "mass transport phenomenon" to bury the active layer. In this device, an active layer of quaternary III-V alloy is grown on a binary III-V compound substrate using conventional liquid phase epitaxial (LPE) techniques. A top layer of a binary III-V compound is similarly epitaxially grown on the active layer.

Next, an oxide stripe mask is formed by conventional photolithography techniques on the top layer.

An undercut mesa structure is then formed by a two-step selective chemical etch. A first etchant is used to remove the top layer where it is not protected by the oxide coating. This top layer is removed down to the active quaternary layer at which point the first etchant step is immediately terminated and a new etchant is used to remove the active layer underneath the remaining top layer, except for a thin volume of active material underlying the remaining top mesa structure.

Next, the structure formed as above, is subjected to a controlled temperature cycle which produces a transport of material so as to fill in the void left at the undercut region and thereby enclose the sides of the remaining volume of the active material.

Lastly, ohmic contacts are provided across the device to enable current to be passed through the structure to produce lasing.

This process produces an improved double heterostructure laser diode of the BH type wherein the active layer is uniformly and narrowly defined, conventional epitaxial regrowth on a non-planar surface is eliminated, the yield is high and the threshold current is low.

Another application of the "mass transport phenomenon" is described in U.S. Pat. No. 4,468,850. In this application, the "mass transport phenomenon" is used to improve fabrication of etched mirror surfaces of laser diodes. This process is shown in FIG. 1 herein, labelled Prior Art. FIG. 1 is a progression of sectional side views of a buried heterostructure laser diode in which a mirror surface is formed on the surface of the diode shown by the arrow M in FIG. 1a. The starting structure consists of a n-doped indium phosphide buffer layer 14 formed over a n-doped indium phosphide substrate 16. A very thin gallium indium arsenide phosphide active layer 18 is formed over layer 14 and a p-doped indium phosphide top layer 12 is formed over the active layer 18.

Next, an oxide coating 20 is applied to the top layer 12 to form a mask by conventional photolithography techniques which ends at surface 42.

After the sample is fabricated, as described above, it is placed in an etchant bath of HCL for a sufficient length of time, such that the indium phosphide material 12, that is not under the oxide 20, is etched away. The etchant process is continued for a little while longer until the indium phosphide is etched a small distance (A), providing an overhang 43 underneath the oxide 20 (See FIG. 1b).

In the next step of the process, (step 3 shown on FIG. 1c), the oxide 20 is removed by conventional techniques and the gallium indium arsenide phosphide quaternary active layer 18 is etched away using an aqueous solution of KOH and $K_3Fe(CN)_6$ (potassium ferricyanide). This etching process is allowed to continue uttil an undercut region is produced for a distance (B), (as shown in FIG. 1c). Next, the sample is subjected to a heat treatment, in which it is heated to a temperature of about 670° C., in an LPE chamber with flowing phosphine gas.

This temperature treatment results in transport of the indium phosphide in layers 12 and 14 to fill in the undercut 44 of FIG. 1c, resulting in the structure shown in FIG. 1d.

Next, as shown in FIG. 1e an oxide 20' is formed on the top layer 12 and layers 12 and 14 are etched in a solution of HCL for a sufficient time to produce an optically flat mirror surface 40, with a small separation B' between the end of the laser active region 18 and the mirror surface 40.

The semiconductor diode lasers described in U.S. Pat. No. 4,468,850, as well as all other known diode lasers now in use, are very small discrete, edge-emitting devices, with the laser mirrors formed by cleaving, i.e., by breaking the substrate along certain crystallographic directions or, in the case of U.S. Pat. No. 4,468,850, by etching along a crystallographic plane. A need exists for a surface-emitting diode laser, i.e., one which emits laser radiation in a direction normal to or perpendicular to the substrate surface. Such a device lends itself to a major advantage of batch processing in a large-area chip containing a great number of laser diodes forming a two dimensional array along with other monolithic circuitry, since substrate-cleaving is no longer necessary.

Attempts to form a surface-emitting diode laser have not been particularly successful. For example, Iga et al. "Lasing Characteristics of Improved GaInAsP/InP Surface Emitting Injection Lasers", *Electronic Letters*, June 23, 1983, Vol. 19, No. 13, have fabricated short cavity lasers in which light is propagated perpendicular to the plane of the p-n junction and the semiconductor layers. This type of structure suffers from the serious disadvantage that it is difficult to get sufficient cavity path length in such a structure. Also, to realize adequate gain to sustain laser emission, nearly 100% reflective mirrors are required.

Itaya, et al., "New 1.5 um Wavelength GaInAsP/InP Distributed Feedback Laser", *Electronic Letters*, Nov. 11 1982, Vol. 18, No. 23 describe a distributed feedback DFB laser of GaInAsP/InP with an etched tilted facet wherein the DFB corrugations are designed to reinforce light waves propagated perpendicular to the active layer and obtain a laser beam coupled out normal to the plane of the p-n junction. This device suffers from the problem that gratings are difficult to make and that the coupling efficiency is low.

Surface-emitting lasers may find particularly useful application as monolithic two-dimensional arrays, as optical interconnects for integrated circuitry and as sources for optical pumping of solid state lasers.

Additionally, the process of forming etched mirror surfaces, as described in U.S. Pat. No. 4,468,850 would be significantly improved if the mirror surface could be formed without the use of an etchant to finally form the mirror surface. It is generally difficult, if not impossible, to obtain the flat perpendicular surfaces required for diode laser mirrors using etchants because the etchant process is extremely sensitive to crystallographic orientation and crystallographic defects.

Consequently, a need also exists for a method of forming mirror surfaces on diode lasers wherein the formation of the final mirror surface, per se, is achieved without the use of etchants.

DISCLOSURE OF THE INVENTION

The present invention relates to a novel process and apparatus for making diode lasers, preferably of the BH type in which an array of such lasers are formed on a single substrate and laser emission is perpendicular to the substrate surface. Furthermore, the mirror surfaces, which enable perpendicular emission, are formed by a process which eliminates use of etchants in the final step of mirror surface formation, per se.

In a preferred embodiment, the foregoing is accomplished by adding parabolic reflective mirrors to a two dimensional array comprising a plurality of BH lasers formed on a substrate.

Buried active layers are first formed on the substrate in a plane parallel to the substrate surface. A planar p-n junction is formed between the buffer layer and an oppositely doped top layer. The diode thus formed emits photons out an edge of the active layer. A light transmissive mirror surface which is partially reflective (hereinafter sometimes called a "partly light transmissive surface" or simply "transmissive surface") is formed adjacent the light emitting edge of the buried active layer and perpendicular to the plane of the active layer and the p-n junction. A light reflective parabolic mirror surface is formed opposite to and adjacent the transmissive surface. The parabolic mirror collimates light emitted from the edge of the active layer which passes through the transmissive surface and reflects the light in a plane perpendicular to the p-n junction.

This enables emitted light to be reflected off the parabolic mirror surfaces perpendicular to the planar array of BH lasers. Preferably, the vertical mirror surfaces and the parabolic mirror surfaces are each fabricated by selective chemical etching to form profiles which approximate the final shape followed by a heat treatment which induces mass transport of material to produce a smooth mirror surface of the finally desired shape.

More specifically, for the parabolic shape, a step structure approximately a parabola is first formed by etching. The desired parabolic surface is obtained if the height of the top step, $t_1$, and lower step, $t_2$, and the width of the step, S, is made to solve the equal volume requirement. By equal volume requirement we mean that the volume to be relocated should be made equal to the volume to be filled. Other embodiments will be shown directed to a lens forming process, a crystallographic 45° mirror with air gap, and forming a bowl of cylindrical, parabolical or spherical shape.

BRIEF DESCRIPTION OF THE DRAWINGS

FIGS. 1a–1e show cross-sectional views of the use of the double etched mass transport phenomenon technique to fabricate laser diode mirror surfaces in accordance with the prior art U.S. Pat. 4,468,850.

FIGS. 2a–2d show cross-sectional views similar to FIGS. 1a–1e of the process of the present invention to form laser diode mirror surfaces.

BEST MODE OF CARRYING OUT THE INVENTION

I. Transported Mirror

Figure 3:
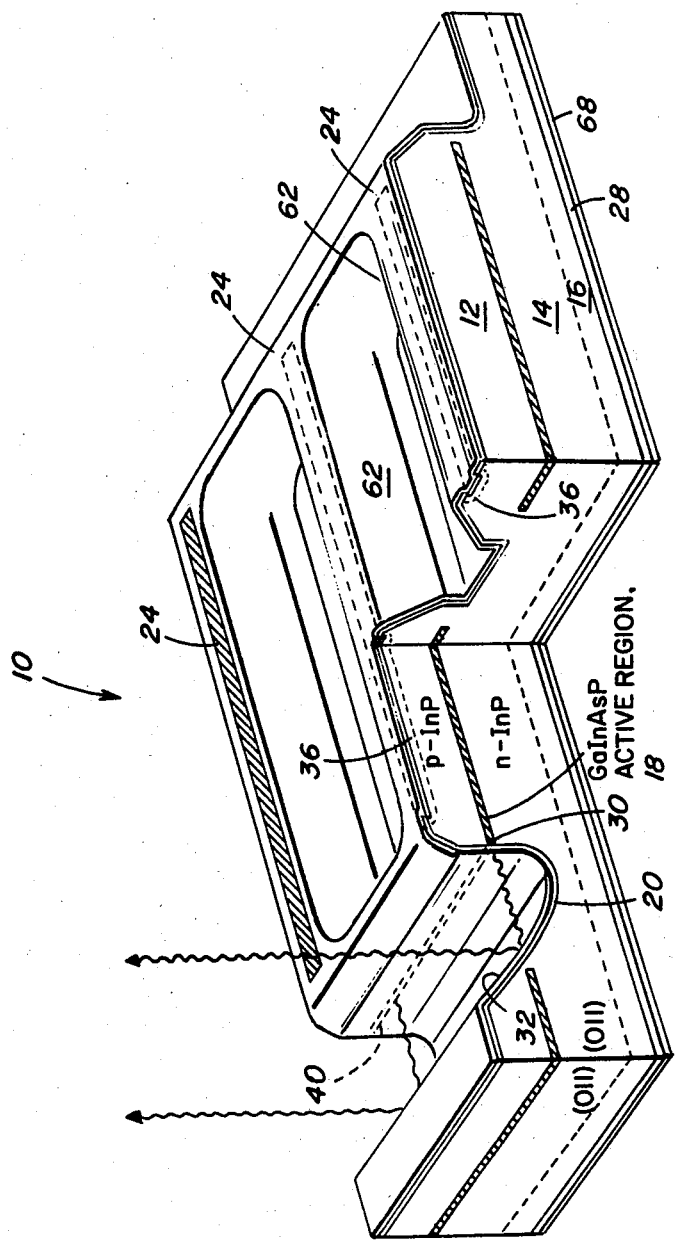
FIG. 3 is a partly sectioned perspective view of a portion of an array of surface emitting BH laser diodes in accordance with the invention.

FIG. 2 shows the method of making a first embodiment of the invention in which a smooth mirror facet is formed at the end of a BH laser mesa by a mass-transport procedure. Except for a surface treatment for improved adhesion of the oxide mask, the initial steps in the procedure are, as described in the prior art patent process shown in FIG. 1. Note that like reference numerals have been used in FIGS. 1 and 2 to facilitate comparison.

The starting structure 10 consists of a n-doped indium phosphide buffer layer 14 formed over a n-doped indium phosphide substrate 16. A gallium indium arsenide phosphide very thin active layer 18 is formed over layer 14 and a p-doped indium phosphide top layer 12 is formed over the active layer 18. All of these layers may be formed by conventional epitaxial growth techniques, such as Liquid Phase Epitaxy (LPE).

An oxide mask coating 20 is applied to the top layer 12. Coating 20 ends at surface 42 and is formed by conventional photolithography techniques. The active region 18 may be buried, in accordance with the techniques described in U.S. Pat. No. 4,468,850, or other, more conventional techniques or may alternatively be appropriately confined instead of buried.

The wafer structure 10 is first treated in an aqueous solution of $K_3Fe(CN)_6$ and KOH. Next, a $SiO_2$ (or phosphosilicate glass, PSG) layer is pyrolytically deposited on the top surface of layer 12. Photolithographic techniques are then used to open up the layer 20 in the region where the mirror is to be formed. The longitudinal cross-section of the laser mesa at this stage is illustrated in FIG. 2a.

The wafer is then cleaned and steps of selective chemical etching are taken in order to obtain the profile shown in FIG. 2c. First, a mixture of $H_3PO_4$ and HCl is used to remove the unprotected InP cap layer 12, as shown in FIG. 2b. Next, an aqueous solution of $K_3Fe(CN)_6$ and KOH is used to remove the exposed GaInAsP active layer 18. These two etching steps are then repeated and the now exposed InP buffer layer 14 is also removed and the desired profile in FIG. 2c is obtained. The wafer is then loaded into a furnace system at a temperature of 670°-690° C. for effectively 30 minutes to form a smooth mirror facet 40, as shown in FIG. 2. The heat treatment results in transport of the InP in layers 12 and 14 to fill in the undercut 44 and results in a remarkably smooth mirror facet 40.

We have found that the pre-oxide-deposition surface treatment is important in preventing large and irregular undercuts when etching. Depending upon the amount of material to be relocated, we have also found that higher transport temperatures, in the order of 690° to 740° C., are more effective in smoothing the mirror facet.

II. Surface Emitting BH Lasers

We will now describe how the new technique for fabricating transported mirrors in BH lasers may be used with some modifications to provide two adjacent mirror facets opposite the light-emitting edge of the active layer of BH diode lasers to reflect light emerging from the light emitting edge of the active layer in a direction perpendicular or normal to the plane of the planar p-n junction formed between the buried layer and the adjacent layer of opposite conductivity. One of the mirror facets is a flat vertical light transmissive adjacent the light-emitting edge and formed in a plane normal to the plane of the buried layer while the other mirror surface is a parabolic reflective mirror surface which collimates and reflects light emerging from the edge to direct the light in a plane perpendicular to the plane of the buried layer and planar p-n junction and out the top surface of the device. The parabolic mirror is formed by smoothing a chemically etched, multi-step structure, using the aforementioned mass-transport phenomenon.

Figure 3A:
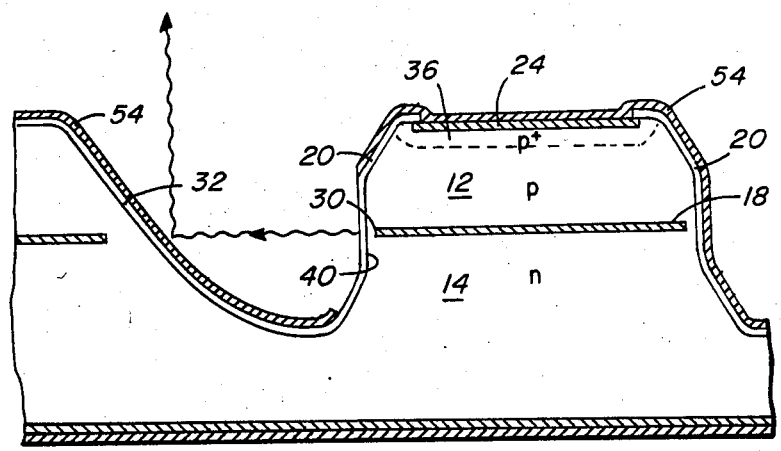
FIG. 3a is an enlarged cross-sectional view of the device of FIG. 3.

Referring now to FIGS. 3 and 3a (wherein like reference numerals have been retained for elements corresponding to elements in FIG. 2) there is shown a partial cutaway perspective of a portion of a two-dimensional array 10 of BH diode lasers formed on a substrate 16. For simplicity, only 3 laser diode mesa structures 62 underlying contact strips 24 are shown in FIG. 3. It should be understood, however, that one wafer may contain a multitude of such lasers 10. Furthermore, it may be desirable to provide support mesas, as in FIG. 7 of U.S. Pat. No. 4,468,850, between the laser mesas 62 for the reasons recited therein. Prior to fabricating the mirror facets 40 and 32, the structure 10 is preferably formed as described in U.S. Pat. No. 4,468,850. However, it should be understood that other well-known techniques for forming stripe geometry laser diodes may be substituted therefore.

Briefly, the starting structures may be formed as described below. The substrate 16 is doped with a concentration of $1 \times 10^{18}$ cm$^{-3}$ n-dopant such as tin. Next, a layer 14 of indium phosphide is formed by LPE over the substrate 16. This layer serves as a buffer layer and is preferably n-doped with tin to a concentration of about $2 \times 10^{18}$ cm$^{-3}$. The thickness of layer 14 is about 2.5 microns. The buffer layer 14 of indium phosphide is formed on the substrate 16 prior to LPE growth of active layer 18 to eliminate surface defects in the substrate surface of the type caused by thermal etching, etc. Thus, layer 14 and substrate 16 may be considered generally to constitute a substrate for the diode structure formed thereon.

An active layer 18 of GaInAsP is formed over the buffer layer 14, again by conventional LPE techniques. The active layer is a very thin film of about 0.2 um and is n-doped to a concentration of about $1 \times 10^{17}$ cm$^{-3}$.

Next, a top layer 12 of indium phosphide is provided over layer 18 with a p-type dopant to a concentration of about $5 \times 10^{17}$ cm$^{-3}$ to form a planar p-n junction at the interface between the layers. Top layer 12 is about 3 um thick. Using photolithographic techniques, oxide stripes (not shown) are provided over the top layer 12. The stripes of oxide are 5-6 um wide on 250 um centers with the stripes parallel to the (011) crystallographic planes. Preferably the substrate 16 is oriented in the (100) crystallographic plane.

Next, mesa structures 62 are formed by etching. Concentrated HCL or Bromine-methanol etchant is used to remove the portions of the InP top layer 12 not underlying the oxide stripes down to the active layer 18. The oxide is then removed and both sides of the exposed active layer are removed and undercut to a depth of about 4 microns. The sample structure is then heat-treated at a temperature of about 650°-700° C. in the presence of phosphine to cause migration of the material adjacent the undercut thereby burying the active region 18 on both sides of the mesa 62.

Figure 4A:
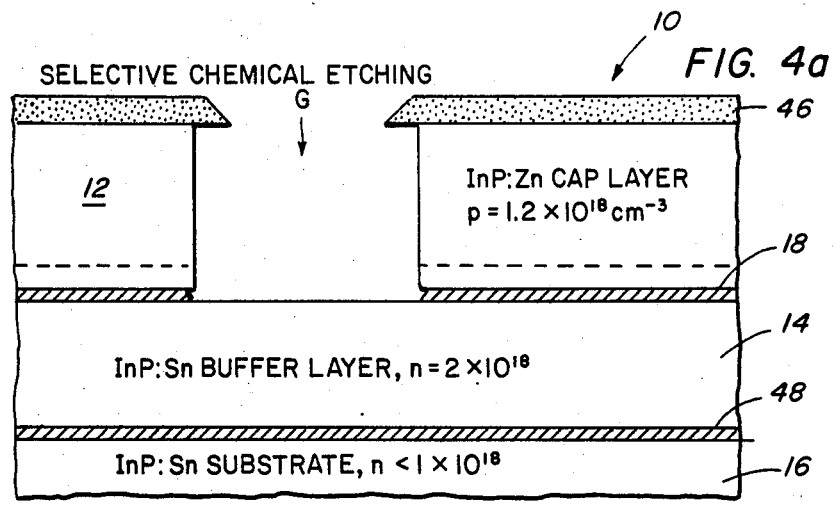
FIGS. 4a–4c show cross-sectional views illustrating the process of forming adjacent vertical and parabolic mirror surfaces on an array of BH laser diodes.
Figure 4B:
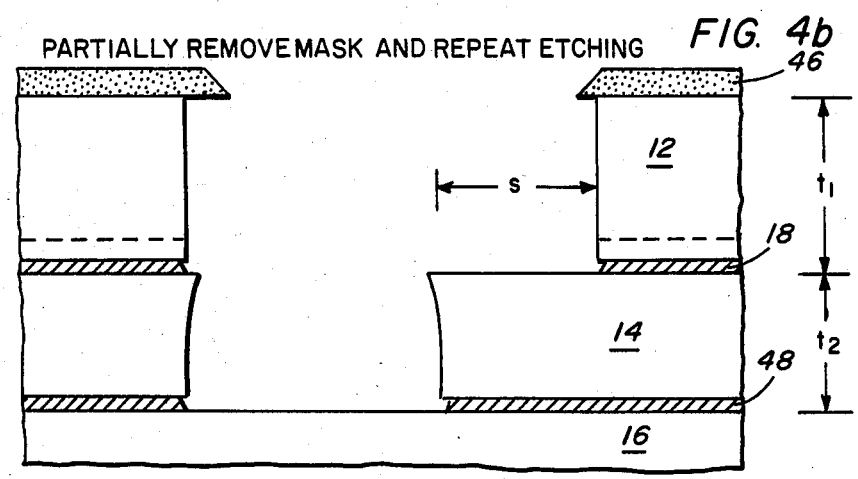
Figure 4C:
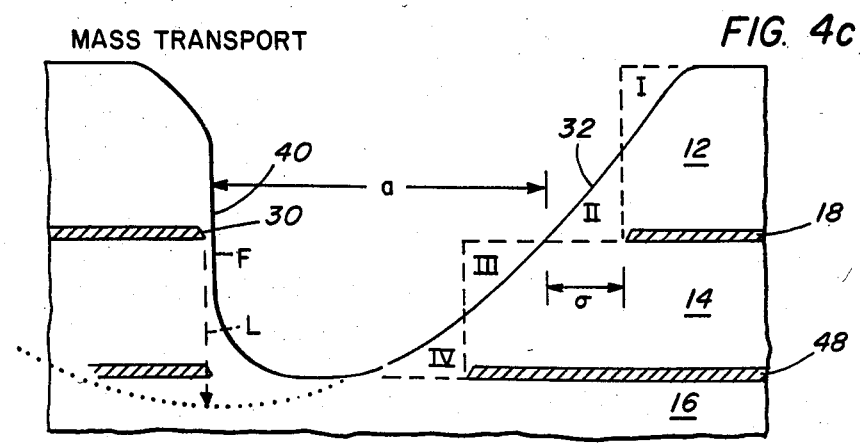

Next, in accordance with the present invention, partly light transmissive vertical mirror facets 40 and 32 are formed adjacent the light-emitting edge 30 of the buried active layer 18 and a reflective parabolic mirror surface 32 is formed opposite the light transmissive mirror 30, as will nbw be described in connection with FIGS. 4a-c. FIGS. 4a-c are schematicized cross-sectional views of the wafer structure 10 during various steps in the process taken at the area wherein the mirror surfaces 40 and 32 are to be located.

First an oxide mask of $SiO_2$ or PSG 46 is formed on the top surface of layer 12 with openings formed to expose portions of the p-InP layer 12 in the area where the mirrors are to be located. A groove G is formed down to the top of layer 14 by the two-step selective chemical etch procedure described above in Section I.

Next, the mask 46 is partially removed on the side in which the parabolic mirror surface 32 will be formed using photolithography and buffer-HF etching. The selective chemical etch procedure is then repeated to produce the two-step or stair structure shown in FIG. 4b on one side of the groove G and a nearly vertical profile on the opposite side adjacent light-emitting edge 30.

Note that for better control of the etched profile, an optional GaInAsP etch-stop layer 48 may be incorporated in the BH laser during initial fabrication, as indicated in FIGS. 4a-c. Note, also, that active layer 18 acts as an etch stopping layer in the first part of the process. After etching, the wafer 10 is stripped of the mask layer 46 and loaded into a furnace system for mass transport at a temperature of 690°-740° C. in an $H_2$ and $PH_3$ atmosphere, to form a nearly parabolic mirror surface 32 out of the stair structure and a smooth vertical surface 40 out of the nearly vertical profile (FIG. 4c).

A mirror profile which exactly follows the curve of a parabola (the dotted curve in FIG. 4c) with a focal length L and a focus F near the buried-heterostructure laser output edge 30 will reduce laser-beam divergence. In order to achieve this highly desirable profile, the stair structure should be fashioned such that regions I, II, III and IV between he parabolic curve and the stair structure have approximately equal areas, as illustrated in FIG. 4c. By integrating the equation for a parabola, expressed as $y = x^2/2a$, it can be verified that the equal-area requirement is fulfilled to within 3 percent (for $\epsilon < 0.13$) by making the height $t_1$ of the top step in FIG. 4b equal to:

$$t_1 = (2 + 8/3\epsilon - 8/9\epsilon^2)\sigma$$

and the height of the bottom step:

$$t_2 = (2 - 4/3\epsilon - 32/9\epsilon^2 - 64/9\epsilon^3)\sigma$$

and the width of the step s:

$$s = (2 + \tfrac{8}{3}\epsilon + 4/9\epsilon^2)\sigma$$

where "a" is twice the focal length L of the parabolic surface 32 and $\sigma$ is the horizontal distance between the parabolic mirror surface and the vertical top step and $\epsilon = \sigma/2a$. Note that this simplified analysis has ignored the rounded edges generally observed on actual mirrors (see FIG. 4c).

We have found that mass-transport temperatures of about 690° to 740° C. are necessary to smooth out larger stair structures. Nevertheless, the wafer surface remains mirror-smooth without a sign of degradation after mass transport at temperatures as high as 740° C.

We have found that to maintain the parabolic mirror surface 32 to within ±5° of the desired 45° angle, the deviation of "s" from the optimum value must be less than about ±0.5 um. This estimation was made for a specific mirror size by using the above-mentioned equal-area requirement.

Referring back to FIGS. 3 and 3a, to complete the process, the sample is coated with an oxide by conventional techniques and striped openings made through the oxide layer 20 by photolithography techniques. A shallow zinc diffusion 36 is made through the openings in the oxide. After the zinc diffusion, Au-Zn alloy contacts 24 are made to the p+ indium phosphide zinc diffused layer 36 on the indium phosphide mesa top layer 12. The sample is then lapped from the substrate side to a thickness of 100 um and a AuSn alloy contact 28 applied to the bottom surface of the structure 10, followed by Ti/Pt/Au layers 68.

The wafer is metallized with Au over Ti layers 54 to facilitate contacting and provide a reflective coating over the parabolic mirror surface. An angle evaporation method of coating is preferred over sputtering for metallization to avoid coating the partially light transmissive vertical mirror surface 40 facing the reflective parabolic mirror surface 32. Note that the laser diode, per se, as shown in FIG. 3, consists of two vertical mirrors comprising a front partly transmissive mirror surface 40 and a back reflective mirror surface 50 and no cleaved mirror is used.

Surface-emitting lasers constructed in accordance with the invention, with low threshold current and high efficiency have been obtained with good yield. For example, 70% of the 26 devices tested without preselection from a single wafer show pulsed threshold currents of 12-18 mA. The active region dimensions measured on this wafer are 0.20 um thickness, 1.1-2.0 um width and 157 um length (the distance between the vertical mirror surfaces 40 and 50). Four devices were mounted p-side up on copper heatsinks and all show room-temperature cw operation (with no increase in threshold current) and very similar surface-emitting far-field patterns.

Far-field patterns, as narrow as 12°, were obtained which are considerably narrower than corresponding patterns of the conventional edge-emitting lasers (typically $\geq 30°$) and are close to the diffraction-limited angular width estimated from the parabolic mirror size. The parabolic mirrors were made from a stair structure with a $t_1$ of 2.7 um, $t_2$ of 2.2 um and s of 2.5 um. The far-field patterns typically show about 5° deviations from the exact vertical direction and could be improved by a more precise control of the stair structure. Some side lobes are observed, especially at large angles. These are possibly due to light scattered off the rounded edges of the parabolic mirror and light that escapes the parabolic mirror due to the large beam divergence of the buried-heterostructure laser diode output. A larger parabolic mirror would probably solve this problem and also achieve a still narrower diffraction-limited beam.

An essentially single-longitudinal-mode operation within an approximately 10-mA current range has been observed. At 30 mA the device produces at a wavelength of 1.3393 um a dominant mode with intensity greater than 125 times the side modes which are 15-Å spaced. This degree of mode purity was not observed in the buried-heterostructure lasers of the 4,468,850 patent and can possibly be attributed to the fact that the present devices have a relatively short cavity, a heavier p-doping, one mirror 32 reflectively coated with Ti/Au and the other (moderately) anti-reflectively coated with PSG or $SiO_2$.

It should be noted that the surface-emitting lasers of the preferred embodiments thus described of the invention have all mirror surfaces fabricated by the mass-transport process and show encouragingly low threshold current and high efficiency comparable to the best of the conventional cleaved-mirror edge-emitting lasers. Moreover, these device characteristics are obtained even though the wafers have been subjected to considerably higher temperatures than used before for mass transport.

III. Lens Formation

Yet another embodiment of the invention will now be described in connection with FIGS. 5 and 6. In this embodiment, a plurality of lenses 80 may be formed on a semiconductor substrate 70. While only one such lens is shown, it is to be understood that many such lenses could be formed on a single substrate and the substrate could be bonded, for example to the top of the array 10 previously described, to collimate light emitted from the surface of the array. Alternatively, the lens could be formed in the process to be described in connection with FIG. 7 to locate the lens at the bottom of the substrate 98, shown on FIG. 7, and further collimate light emitted from the bottom of the substrate 98.

Figure 5A:
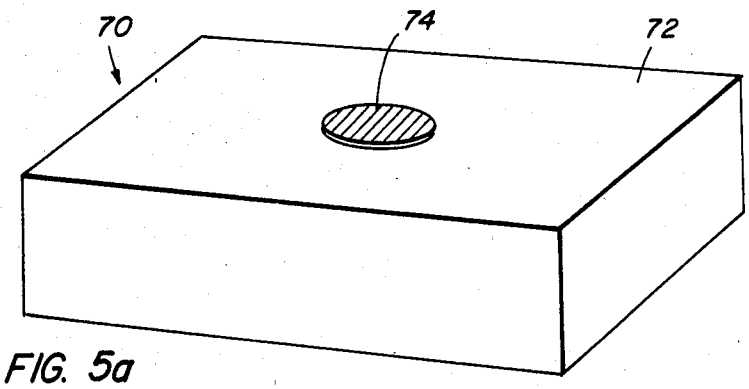
FIG. 5 is a perspective view of a series of steps of further embodiment of the invention in which the mass transport phenomenon is used to fabricate a lens on a semiconductor structure.
Figure 5B:
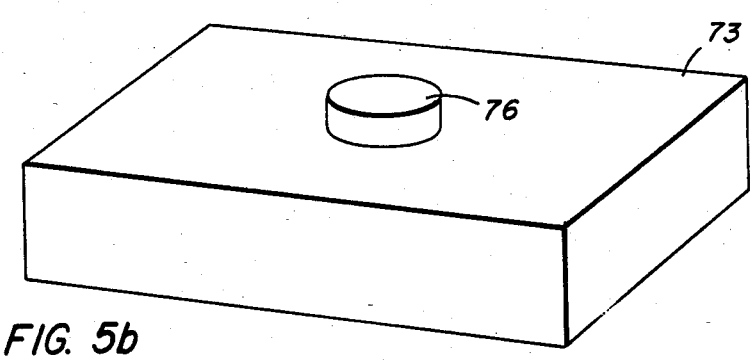
Figure 6A:
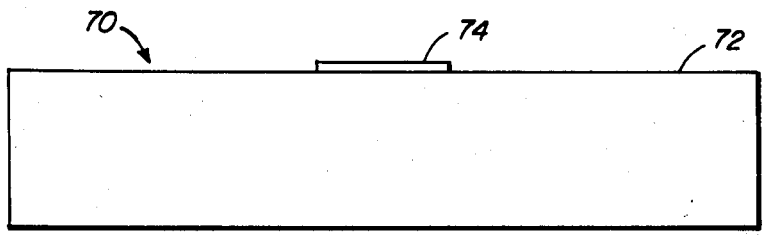
FIG. 6 is a cross-sectional view of the FIG. 5 structure showing the details of the various steps in the process shown in perspective in FIG. 5.
Figure 6B:
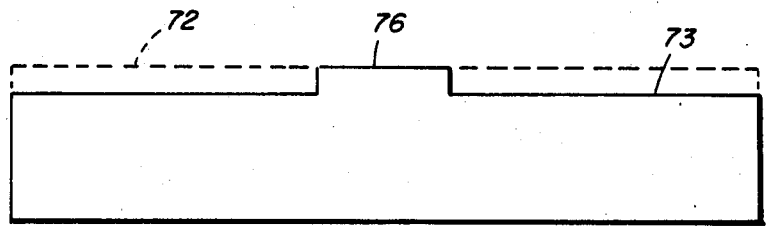

Substrate 70 may comprise semiconductor material of crystallinity compatible with the device to which it is to be attached or in which it is to be formed. In this specific example, indium phosphide would be a suitable material for the substrate. The first step in the process is to form a circular oxide mask 74, as shown in FIGS. 5a and FIG. 6a. This mask is formed by well-known photolithographic techniques on the top surface 72 of the substrate 70.

Figure 6C:
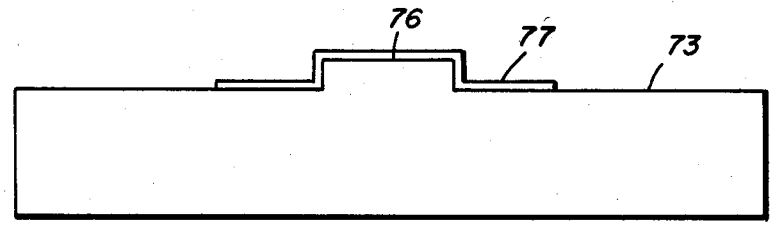

Next, the material which is not underlying the mask 74 is etched away to expose a new surface 73 leaving an etched mesa 76 of cylindrical configuration protruding therefrom. (See FIGS. 5b and 6b.) Another circular oxide mask 77 is formed over the mesa 76 and the new surface 73, as shown in FIG. 6c.

Figure 5C:
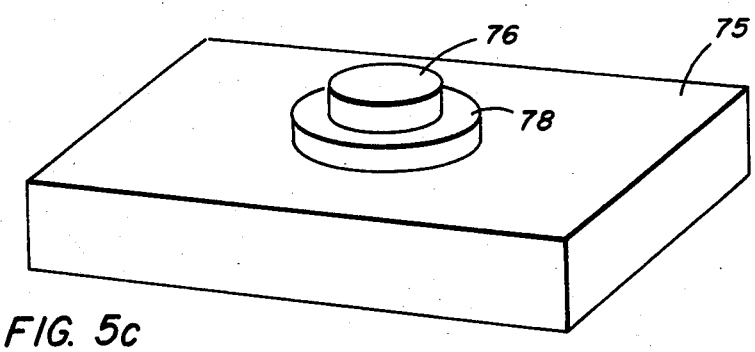
Figure 5D:
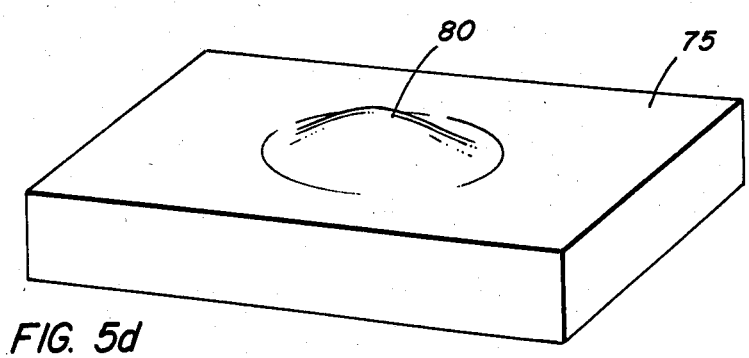
Figure 6D:
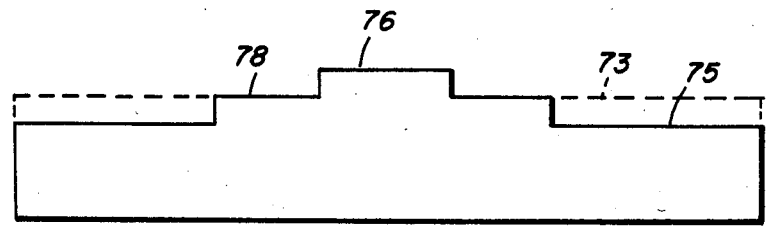
Figure 6E:
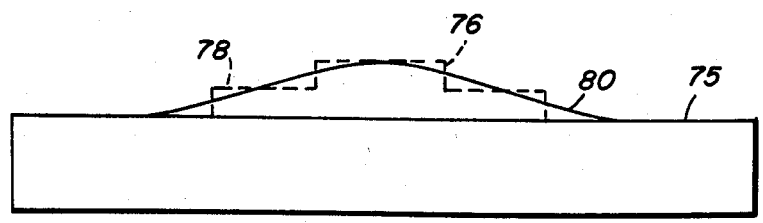

Next, the material not underlying the mask 77 is etched away exposing another new surface 75 leaving a protruding stepped etched cylindrical mesa with a top mesa 76 and a bottom mesa 78, each of cylindrical shape, as shown in FIG. 5c and FIG. 6d.

Next, the substrate is subjected to a heat treatment, as previously described, to relocate the material of the cylindrical mesas to form a lens surface 80. Suitable etchants, as indicated in the previous descriptions, may be utilized to make the stepped cylindrical structures 76 and 78 and the principle explained earlier of the equal volume requirement should be satisfied in designing the dimensions of the steps on the mesa to obtain the desired lens surface shape. Grown quarternary layers can be used as etch-steps for precise control of the step sizes.

IV. Substrate Surface Emitting Laser Array

Referring now to FIG. 7, a further embodiment of the invention will be explained in connection therewith. In this embodiment of the invention, a pair of crystallographic 45° light reflective mirrors are fabricated adjacent the light emitting edge of a buried active layer diode laser. Laser radiation is directed at a 90° angle to the plane of the active layer and out the substrate surface to provide a directed surface emitting laser diode structure. Two partly light transmissive mirrors are provided by forming air gaps between the 45° mirrors and the substrate to provide optical feedback.

Figure 7A:
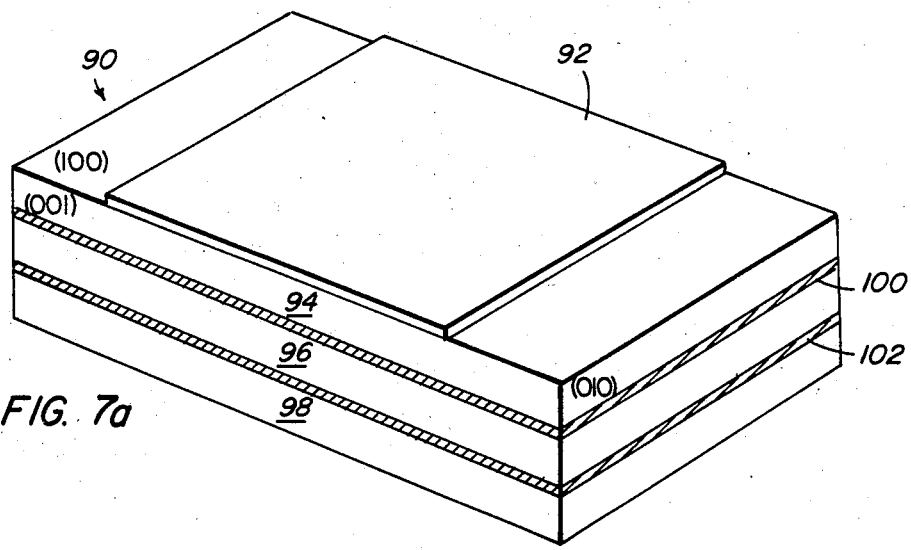
FIG. 7a is a perspective followed by cross-sectional views 7b–7d of the process of forming crystallographic 45° mirrors on a buried layer heterostructure to reflect light in a plane perpendicular or normal to the p-n junction and out the bottom substrate surface underlying a laser mesa diode.
Figure 7B:
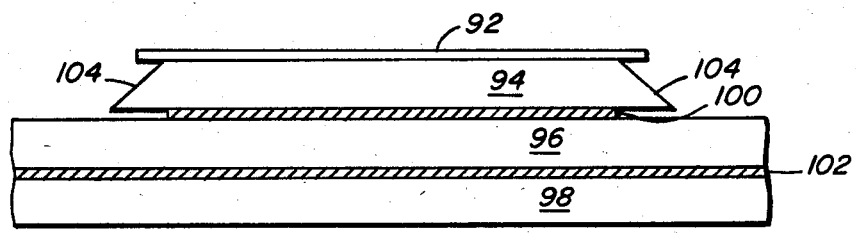

The starting structure for fabrication of such a device is shown in perspective in FIG. 7a to comprise a substrate layer 98 which may be formed of n-doped indium phosphide. Over this substrate, a layer 102 of gallium indium arsenide phosphide is formed to provide an etch stop layer which will be subsequently used to expose an air gap 106 (FIG. 7d).

Next, a further n-doped indium phosphide buffer layer 96 is formed over layer 102 and an active layer 100 of gallium indium arsenide phosphide formed over the indium phosphide layer 96. A top layer of p-doped indium phosphide 94 is then formed over layer 100, providing a planar p-n junction at the interface between the layers. Preferably, the substrate layers have their crystallographic planes oriented, as shown in FIG. 7.

An oxide mask 92 is formed on the top surface 94. By selective chemical etching using the etchants previously described, surfaces 104 underlying the oxide mask are formed at a 45° angle to the plane of the p-n junction device 90. The 45° angle is obtained by virtue of the fact that the crystallographic plane of the top layer 94 is oriented as shown with the 001 plane being at the long face of the active layer and the 010 plane being oriented normal thereto.

Next, a different etchant is used to undercut layer 100 below layer 94. In this manner, the structure shown in FIG. 7b is formed. Next the wafer is subjected to a heat treatment at the temperature and for a time period previously given to transport some of the material from layers 94 and 96 into the undercut region to bury the active layer 100 and form the structure shown in FIG. 7c.

Figure 7C:
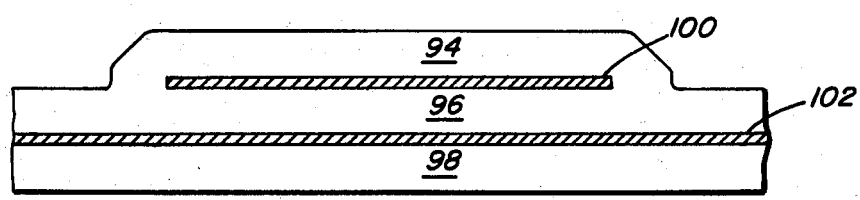
Figure 7D:
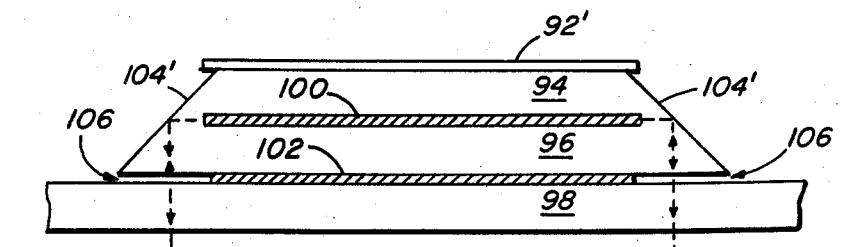

Next, as shown in FIG. 7d, an oxide mask 92' again is formed again over the structure shown in FIG. 7c and the selective etching process is resumed to form mirror surfaces 104' at a 45° angle with respect to the plane of the p-n junction formed between layer 96 and top layer 94. These mirror surfaces 104' extend down to the top of etch stop layer 102. A second etchant is then used to remove a portion of layer 102 to form an undercut region 106. This undercut region 106 results in an air gap which has a different index of refraction than the index of refraction of the light transparent material forming layer 96. Thus, light emitted from the edges of active layer 100 may be totally reflected off the 45° mirror surfaces 104' and allowed to partially reflect to provide feedback for the active laser diode layer 100 and, ultimately, laser emission out through the bottom of substrate 98, in a plane normal to the plane of the p-n junction, as shown by the dotted lines in FIG. 7d.

V. Fabrication of Spheroids

Figure 8:
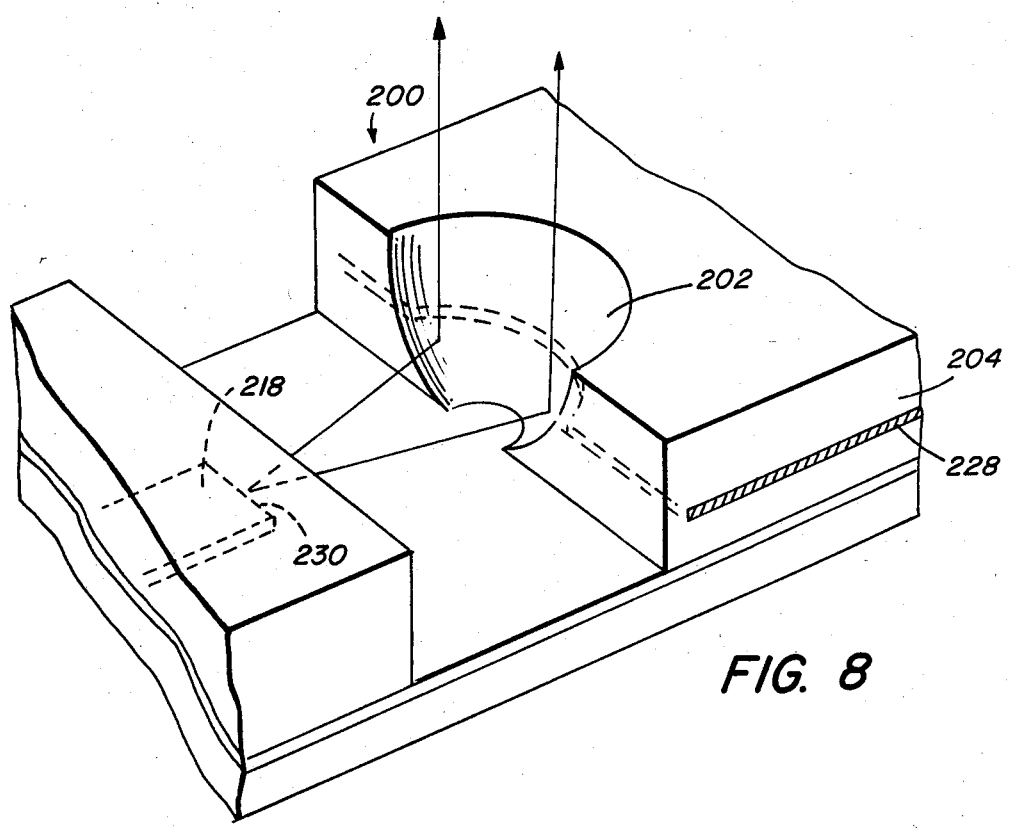
FIG. 8 is a perspective view of a cylindrical lens surface of spherical or paraboloidal curvature formed adjacent the edge of a buried active layer laser diode for the purpose of collimating and focusing light emitted from the layer edge.

FIG. 8 will be used to describe yet a further embodiment of the invention in which a spherical surface 202 may be formed adjacent a buried active layer 218 formed in a laser diode device. In the device of FIG. 8 it is assumed that the starting structure is basically as shown in FIG. 3 with certain details omitted for simplicity. In the embodiment of FIG. 8, curved terraces instead of planar terraces or steps are formed on wall 220 opposite to, but adjacent the light emitting edge 230 of buried active layer 218 to provide a two-dimensional paraboloid mirror for light emitted from the edge 230. In this example, the mask forming oxide would be appropriately dimensioned to project circular curves at the etch-stop surfaces 228 and 226.

This completes the description of the preferred embodiments of the invention, however, it is to be understood that while lasers using a heterojunction of the quaternary III-V alloys of indium gallium arsenide phosphide have been chosen to illustrate the invention; other alloys may be utilized equally as well. As an example, alloys of the IV-VI semiconductors, such as germanium IV and selenium VI and lead and tellurium may be utilized. Similarly, instead of indium phosphide, other III-V alloys could be considered, such as gallium antimonide.

The term quaternary III-V alloy of InGaAsP means that the elements are proportioned according to the formula, $In_xGa_{1-x}As_yP_{1-y}$ or the equivalent mole fraction formula $In_{0.5x}Ga_{0.5-0.5x}As_{0.5y}P_{0.5-0.5y}$. Also, the invention is not to be limited to any particular etchant, merely that the second etchant has to be capable of etching the active layer with negligible etching of the buffer layer or the top layer.

While the heretofore described embodiments have been explained in connection with the use of a wet chemical etching process, it is also contemplated that other means of producing the undercuts or grooves may be realized by those skilled in the art, such as plasma etching.

The process herein described could be used for fashioning any type of mirror surface, not merely vertical or parabolic. Hyperbolic and elliptical surfaces can be envisioned utilizing the teachings of this invention.

While the particular embodiments of the invention disclosed herein have been fabricated utilizing LPE techniques, it should be emphasized that suitable layers could be formed using other deposition techniques, such as vapor phase epitaxy or molecular beam epitaxy. Additionally, whereas the substrates enumerated herein have been n-type indium phosphide, it is clear that the substrates could be p-type, in which case the top layer would be of opposite type conductivity. Also, additional quaternary or other layers may be present in addition to those layers above enumerated.

It is envisioned that the approximate final contour of the mirror surfaces may be achieved by discrete etchant steps, as explained herein, and the steps filled in by supplying material from an external source, such as by depositing material by LPE, instead of using the mass transport phenomenon to smooth out the approximated surface contour.

While most of the embodiments herein described are primarily concerned with laser oscillator devices, it is possible to use the concepts of the invention for light amplification. For example, in the embodiment of FIG. 7, the undercut volume 106 may be omitted and instead of reflecting light at this interface for feedback purposes, light may be fed into the substrate on one side and amplified in the acitve layer 100 and taken out the other side.

Equivalents

Hence, the invention is not to be construed as limited to the particular embodiment shown and described herein. There are many equivalents to these specific embodiments and such equivalents are intended to be covered by the following claims:

We claim:
1. The method of forming a collimating element on a semiconductor surface comprising the steps of:
 (a) forming layers of semiconductor material on a substrate;
 (b) selectively etching the semiconductor layers to form a surface profile approximating the desired profile of the collimating element;
 (c) smoothing the surface to the shape of the desired profile by a heat treatment without etching.

2. The method of claim 1 wherein the surface is smoothed by relocating material by heating the material at a sufficient temperature for a sufficient duration to cause the material outside the desired profile to migrate and fill the voids in the approximated profile.

3. The method of claim 2 wherein the etch stop layer material is a quaternary III-V alloy and the material of the other layer is a binary compound.

4. The method of claim 3 wherein the quaternary III-V alloy is GaInAsP and the binary compound is InP.

5. The method of claim 1 wherein the collimating element is a spherical lens.

6. The method of claim 5 wherein the spherical lens is a paraboloid.

7. The method of claim 1 wherein the surface is smoothed by depositing a layer of material over the approximated surface.

8. The method of claim 1 wherein the collimating elements are formed adjacent a light emitting edge of an active layer of a laser diode formed in said semiconductor.

9. The method of claim 1 wherein the semiconductor layers form planar p-n junctions therebetween and light is collimated in a plane normal to the p-n junction.

10. The method of claim 1 wherein the collimating element comprises a vertical partly light transmissive surface adjacent a parabolic reflective surface.

11. The method of forming an array of surface emitting laser semiconductor devices comprising the steps of:
 (a) making a plurality of adjacent mesa structures on a substrate by:
  (i) forming a substrate;
  (ii) forming a first layer of semiconductor material over said substrate;
  (iii) forming a second layer of semiconductor material on the first layer;
  (iv) forming a first coating over a portion of said second layer;
 (b) removing a plurality of portions of said second layer on two adjacent sides of said protective coating down to the top surface of said first layer;
 (c) removing a plurality of portions of said first layer underlying adjacent sides of said second layer so as to produce undercut areas beneath the remaining second layer with volumes of first layers therebetween, said volumes of first layer having top, bottom and four side walls, with two adjacent side walls thereby being exposed to the atmosphere; and
 (d) heating the structure in a controlled environment to a temperature which causes the material in the regions of the undercut areas to travel into the undercut area and enclose the exposed side walls;
 (e) forming a second coating over said second layer with striped openings aligned with the portions of the first layer; and
 (f) removing portions of said second layer and first layer to expose first and second opposing walls;
 (g) forming in said mesa structure a partly light transmissive surface on the first opposing side wall and a light reflective parabolic surface adjacent said partly light transmissive surface on the second opposing wall.

12. The method of claim 11 wherein the light transmissive and light reflective surfaces are formed by heating the structure and coating the parabolic surface with a reflective coating.

13. The method of claim 11 wherein the substrate and second layer is InP and the first layer is GaInAsP.

14. The method of claim 11 wherein the light transmissive surface is formed in step (g) by:
 (a) removing a portion of the substrate vertically below the striped openings until a nearly vertical profile groove is obtained below the striped openings;

(b) selectively removing the exposed first layer and forming a small undercut region in the first layer below the second layer; and (c) heating the structure to a temperature which will cause the material in the area of the vertical profile to migrate and fill in the undercut and form a smooth flat vertical mirror surface adjacent the side wall of the first layer and coating the surface with an oxide.

15. The method of claim 14 wherein the parabolic surface is formed by removing a portion of the first and second layers on a side of the groove down to the substrate in the groove adjacent the side upon which the vertical mirror surface is to be formed to form a step-like profile in which the upper second layer is laterally recessed a distance "s" and wherein $t_2$ is the thickness of the first layer and $t_1$ is the thickness of the second layer with respect to the lower first layer then forming said step-like profile into a parabolic profile by subjecting the side to the heat treatment of step (b) of claim 23 and coating the profiled surface with a light reflective material.

16. The method of claim 11 wherein the substrate includes a buffer layer with an etch stop layer beneath the buffer layer.

17. The method of forming smooth vertical surfaces on a semiconductor device comprising the steps of:
(a) making a body by:
 (i) forming a substrate;
 (ii) forming an active layer of semiconductor material on the substrate;
 (iii) forming a top layer on the active layer; and
 (iv) forming a coating over a portion of the top surface with openings provided where the smooth surfaces are to be located;
(b) removing a portion of said top layer through said openings down to the top surface of the active layer;
(c) removing the exposed portion of said active layer;
(d) removing a portion of the substrate below said opening to form a nearly vertical cross-sectional profile below the openings;
(e) removing the newly exposed active layer and producing a small undercut area beneath the remaining top layer; and
(f) heating the body to cause the material in the top layer and substrate in the region of the undercut to fill in the undercut area and embed the exposed edge of the active layer and form a smooth mirror surface adjacent thereto.

18. The method of forming a smooth vertical surface on a heterostructure semiconductor laser device comprising the steps of:
(a) making a heterostructure by:
 (i) forming a substrate;
 (ii) forming an active layer of quaternary III-V alloy semiconductor material on the substrate;
 (iii) forming a top layer of a binary compound semiconductor material on the active layer; and
 (iv) forming a coating over a portion of the top surface of the top layer with strip openings over the area where the smooth vertical surface is to be formed;
(b) removing a portion of said top layer down to the top surface of the active layer by etching said binary compound but not said III-V alloy;

(c) removing the exposed portion of said active layer by etching said quaternary III-V alloy but not said binary compound;
(d) further removing portions of said substrate below the strip openings;
(e) removing the newly exposed portion of the active layer; and
(f) heating the heterostructure to cause the material in the region of the undercut area to migrate into the undercut area adjacent the active layer and form a smooth vertical surface adjacent said active layer.

19. The method of forming a surface light emitting quarternary III-V layer in a heterojunction device having alternate layers of quaternary III-V material and binary III-V material comprising the steps of:
(a) selectively etching only the binary material until a mesa of binary material is formed over the layer of quaternary material and a surface of quaternary material is exposed on two sides of said mesa;
(b) selectively etching only the quaternary material at the exposed surfaces until two undercut regions are formed under the mesa with a layer of quaternary material therebetween which is exposed on two sides; and
(c) filling in the undercut region with binary material from said means sufficient to bury the exposed portion of said quaternary material;
(d) selectively etching only the binary material on the means at an area where a smooth vertical surface is to be located to expose the two previously unexposed sides of the quaternary material;
(e) selectively etching only the quaternary material thus exposed;
(f) selectively etching the binary material in the space below and between the adjacent undercut regions; and
(g) filling in the two adjacent undercut regions with binary material to bring the exposed portions of the quaternary material and form a smooth vertical surface adjacent one of the filled-in undercut regions and a parabolic surface adjacent the other.

20. The method of claim 15 wherein "$t_1$" is approximately equal to $(2+8/3\epsilon-8/9\epsilon^2)\sigma$, "$t_2$" is approximately equal to $(2-4/3\epsilon-32/9\epsilon^2-64/9\epsilon^3)\sigma$, "s" is approximately equal to $(2+\frac{2}{3}\epsilon+4/9\epsilon)\sigma$ and wherein: $\epsilon$ is $\sigma/2a$;
a is 2L;
L is the focal length of the parabolic profiled surface; and
$\sigma$ is the horizontal distance between the parabolic profiled surface and the adjacent smooth vertical surface.

21. The method of claim 18 wherein the active layer is formed of GaInAsP and the top layer is formed of InP.

22. The method of claim 19 wherein the quaternary material is GaInAsP and the binary material is InP.

23. A method of forming an array of surface emitting laser semiconductor devices comprising the steps of:
(a) forming a plurality of edge emitting active laser devices on a monolithic substrate, said edge emitting active laser devices comprising p-n junctions formed of III-V material wherein laser light is emitted from said devices in a direction parallel to the plane of the p-n junction; and
(b) forming a smooth partly light transmissive surface extending vertically normal to said plane and adjacent said junction; and (c) forming a parabolic light reflective surface opposite said normal surface to direct laser light emitted from said laser in a direction normal to said plane of the p-n junction.

24. The method of claim 1 wherein at least one of said layers comprises an etch step layer.

25. The method of claim 24 wherein the semiconductor material comprises InP and the etch step layer is comprised of GaInAsP.

* * * * *

UNITED STATES PATENT AND TRADEMARK OFFICE
CERTIFICATE OF CORRECTION

PATENT NO. : 4,784,722
DATED : Nov. 15, 1988
INVENTOR(S) : Zong-Long Liau and James N. Walpole It is certified that error appears in the above—identified patent and that said Letters Patent is hereby corrected as shown below:

Col. 14, line 26, "means" should be ---mesa---.

Col. 14, line 29, "means" should be ---mesa---.

Col. 14, line 45, "$(2+\frac{2}{3}\epsilon+4/9\epsilon)\sigma$" should be ---$(2+\frac{2}{3}\epsilon+4/9\epsilon^2)\sigma$---.

Signed and Sealed this

Twenty-first Day of March, 1989

*Attest:*

DONALD J. QUIGG

*Attesting Officer*  *Commissioner of Patents and Trademarks*